United States Patent [19]

Puckette, IV et al.

[11] Patent Number: 4,888,557
[45] Date of Patent: Dec. 19, 1989

[54] DIGITAL SUBHARMONIC SAMPLING DOWN-CONVERTER

[75] Inventors: Charles M. Puckette, IV, Scotia; Gary J. Saulnier, Rexford, both of N.Y.

[73] Assignee: General Electric Company, Schenectady, N.Y.

[21] Appl. No.: 335,269

[22] Filed: Apr. 10, 1989

[51] Int. Cl.[4] .............................................. H03D 3/00
[52] U.S. Cl. .................................... 329/341; 455/205
[58] Field of Search ................ 329/50, 110, 112, 122, 329/124; 455/205; 375/78

[56] References Cited

U.S. PATENT DOCUMENTS 4,647,864  3/1987  Rafferty et al. .................... 329/122
4,755,761  7/1988  Ray, Jr. .............................. 329/50

Primary Examiner—Eugene R. Laroche
Assistant Examiner—Robert J. Pascal
Attorney, Agent, or Firm—Geoffrey H. Krauss; James C. Davis, Jr.; Marvin Snyder

[57] ABSTRACT

A digital subharmonic sampling converter, for use in an analog IF signal demodulator and the like, includes: an analog-to-digital converter (ADC) means receiving the IF analog signal for conversion to a digital data stream by sampling at a sampling rate frequency substantially equal to $4/(2n+1)$ times the IF signal frequency, where n is an integer greater than zero. A digital mixer means is used to convert the sampled data to baseband. The interleaved sequential in-phase I data words and quadrature-phase Q data words are then sorted into a pair of concurrent I and Q data word streams.

9 Claims, 6 Drawing Sheets

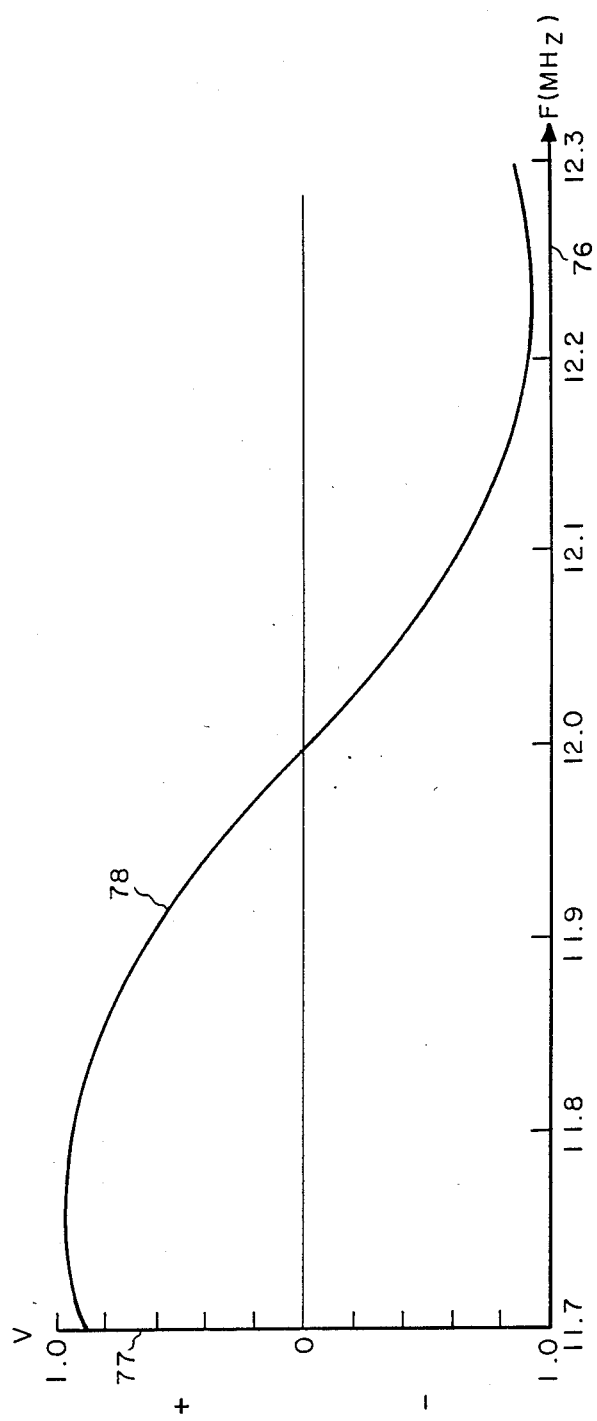

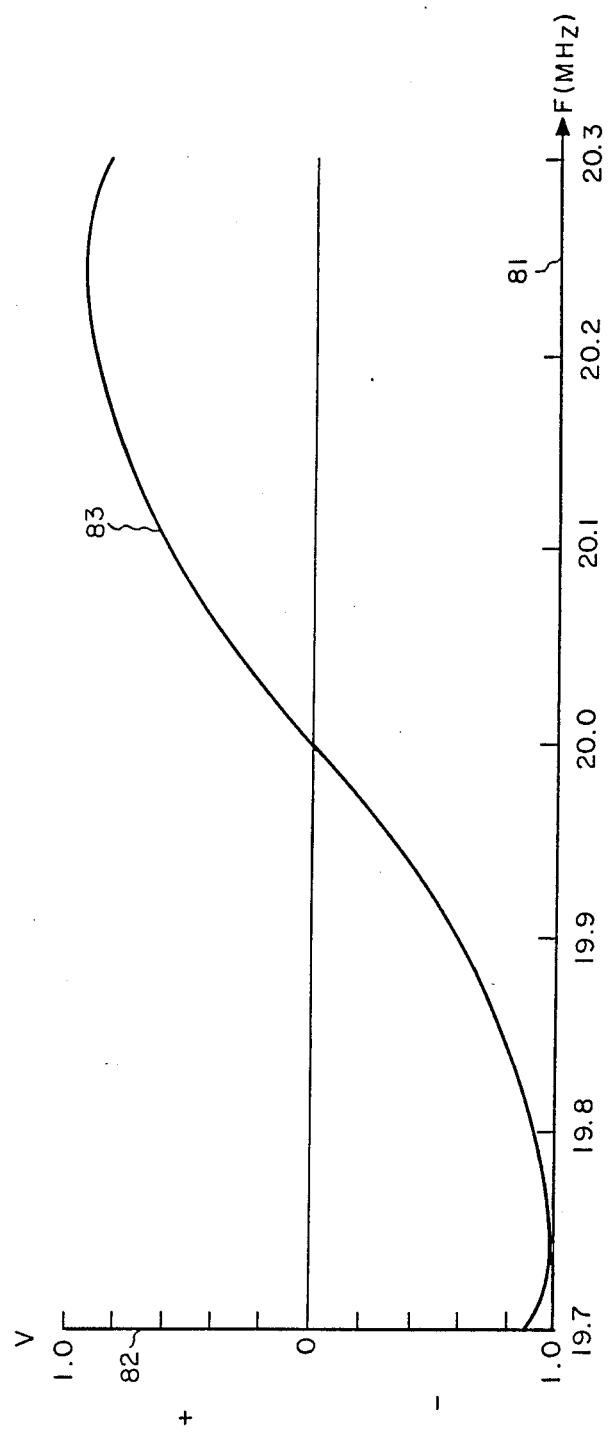

DIGITAL SUBHARMONIC SAMPLING DOWN-CONVERTER

The present invention relates to apparatus for recovering the modulating signal from a modulated RF carrier signal and, more particularly, to a digital subharmonic sampling down-converter for converting an intermediate-frequency (IF) signal to baseband for subsequent demodulation, and using a sampling signal at a rate of $4/(2n+1)$ times the IF frequency, where n is an integer greater than zero.

It is well known to utilize a superheterodyne form of receiver, in which the received carrier signal is frequency converted to an intermediate frequency (IF) at which filtering and modulation detection are accomplished. It is highly desirable to provide the IF receiver portion, and especially the modulation detection portion thereof, in monolithic integrated circuit form.

PRIOR ART

One integratable demodulator is the baseband, or zero IF, FM demodulator described and claimed in U.S. Pat. No. 4,755,761, issued July 5, 1988, assigned to the assignee of the present invention and incorporated herein in its entirety by reference. A zero-IF baseband demodulator receives the down-converted IF signal for application to a first input of each of first and second RF mixer means; a locally-generated LO signal at the carrier frequency is applied directly to a second input of one of the mixer means and is phase-shifted by 90° to provide a quadrature LO signal at a second input of the other mixer means. The baseband signals at the mixer outputs are respectively an in-phase signal and a quadrature-phase signal with spectra centered at a frequency of approximately zero Hz. After suitable lowpass filtering, a baseband in-phase I signal is provided at a first intermediate node, while a baseband quadrature-phase Q signal is provided at a second intermediate node. We denote the portion of the demodulator prior to the intermediate nodes as a converter, and denote the portion after the intermediate nodes as a detector. In an FM demodulator, the detector can be a discriminator, in which each of the I and Q signals is delayed by a time interval $\Delta t$ to provide respective delayed in-phase signal I′ or quadrature-phase delayed signal Q′. A first multiplier receives the delayed I′ signal at a first input and the undelayed Q signal at a second input to provide at an output signal which is the QI′ product, and is applied to a first input of a summation means. A second multiplier means receives the delayed Q′ signal at its first input and the undelayed I signal at its second input for providing at its output a product IQ′ signal, for application to a subtractive second input of the summation means. The difference signal at the summation means output is provided at the detector output, and is the modulation data which has been recovered from the frequency-modulated IF input signal. By alteration of the circuitry after the intermediate input nodes, either phase-shift keyed (PSK) or continuous-phase/frequency-shift-keyed (CPFSK) modulation, as well as other digital modulation forms, can be recovered.

It will be seen that such a demodulator utilizes a number of analog blocks; it is highly desirable to utilize digital signal processing to reduce the size, power and unit cost and increase the reliability of each of these blocks, as well as to facilitate the fabrication of a completely digital demodulator as part of a single integrated circuit chip. One promising digital demodulator is that of W. Rafferty et al., as described and claimed in U.S. Pat. No. 4,647,864, issued Mar. 3, 1987, assigned to the assignee of the present invention and incorporated herein in its entirety by reference. This non-coherent digital demodulator of FM signals utilizes an analog-to-digital converter for converting the analog FM signal at the IF frequency to a sampled stream of digital data words, which are applied to a digital mixer for frequency-translation to baseband, and which provides the means for sorting the digital data word stream into separate I and Q data streams which comprise the baseband representation of the modulated waveform. The use of a converter outputting two baseband data streams is necessary in order to retain both the phase and frequency information contained in the IF signal. A subsequent digital non-coherent detector is used to extract a sine function whose argument is proportional to the modulating signal. This function provides a demodulator digital data output, which can, if required, be converted back to an analog signal to provide a demodulator analog output. While substantially of digital nature, the entire converter-discriminator apparatus was found to produce a pair of undesired output side lobes whenever the sampling frequency was not exactly equal to four times the carrier frequency, and was also found to contain a second pair of undesired sidelobes, if the aforementioned frequency offset was present and there also was any DC content in the IF input signal. These two problems, associated with the converter portion of the apparatus, can be solved with the use of a complex digital sampling converter, as described and claimed in U.S. application Ser. No. 280,073, filed Dec. 5, 1988, or a digital sampling down-converter with digital Hilbert transform filtering, as described and claimed in U.S. application, Ser. No. 321,697, filed Mar. 10, 1989, both assigned to the assignee of the present invention and incorporated herein in their entireties by reference. In each of these applications, the down-converter must be supplied with a local-oscillator (L.O.), or sample CLK clock, signal at a frequency ($f_c$) essentially equal to four times the center frequency ($f_{IF}$) of the IF bandpass i.e. $f_c = 4f_{IF}$. The maximum value of the clock frequency $f_c$ determines the maximum IF frequency $f_{max} = f_c/4$ that can be used. This prevents higher IF signals frequencies from being used, unless an analog-to-digital converter (ADC) with extended sampling capability is provided. Such high-sampling-frequency ADCs not only are expensive, power-consumptive and large, but also generally trade off accuracy (which may be necessary for a particular use) for the higher sampling speed. A highly desirable digital sampling down-converter will be capable of operating with input IF signals having a center frequency which is greater than one-fourth the sampling frequency.

BRIEF SUMMARY OF THE INVENTION

In accordance with the invention, a digital subharmonic sampling converter, for use in an IF signal demodulator and the like, includes: an analog-to-digital converter (ADC) means receiving the IF analog signal for conversion to a digital data stream by sampling at a sampling rate frequency substantially equal to $4/(2n+1)$ times the IF signal frequency, where n is an integer greater than zero; digital mixer means for converting the sampled data to baseband; and means for sorting the interleaved sequential in-phase I data words and quadrature-phase Q data words into a pair of concurrent I and Q data word streams. Advantageously, means are present both for removing the effects of DC offset in the analog IF signal applied to the ADC, and for correcting misalignment errors in the concurrent I and Q streams.

Accordingly, it is an object of the present invention to provide a novel digital subharmonically sampled down-converter.

This and other objects of the present invention will become apparent upon reading the following detailed description of the invention, when considered in conjunction with the associated drawings.

BRIEF DESCRIPTION OF THE DRAWINGS

FIGS. 4a-4c are demodulator output graphs, depicting recovered output voltage (V) versus input analog frequency $f_{IF}$, respectively: for n=0 and 1; n=1 with reduced sampling rate; and n=2.

DETAILED DESCRIPTION OF THE INVENTION

Figure 1:
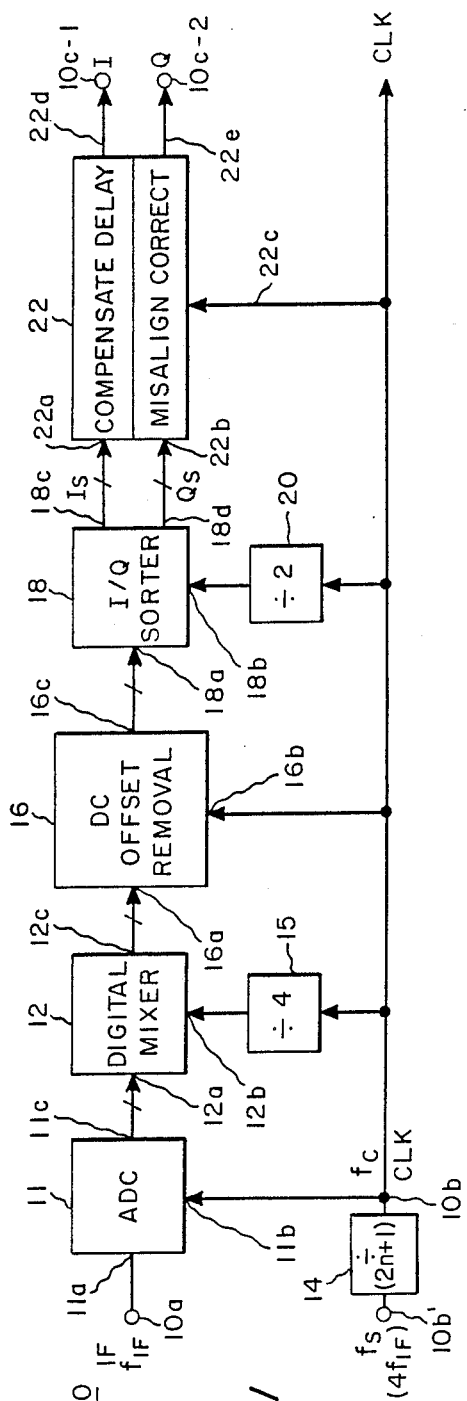
FIG. 1 is a schematic block diagram of one possible digital sampling converter, to be operated in accordance with the principles of the present invention, for producing baseband I and Q signals.

A present preferred embodiment of our novel subharmonically-sampling down-converter is illustrated with respect to the embodiment 10 shown in FIG. 1. The down-converter is usually used with a subsequent modulation detector, such as a digital frequency discriminator and the like, which uses an in-phase I data signal and a quadrature-phase Q data signal, respectively, provided at outputs of the down-converter. The fully-digital discriminator implementation in the Rafferty et al. patent can be, and preferably is, utilized for this discriminator, if a digital FM demodulator is to be implemented. The exemplary digital sampling converter means 10 receives an analog intermediate-frequency (IF) signal, at an IF frequency $f_{IF}$, at a first input 10a, and receives a periodic sampling clock CLK signal, at a sampling clock frequency $f_c$, at a second input 10b, to provide the pair of substantially simultaneous streams of I and Q data words at a pair of output terminals 10c-1 and 10c-2 which can be the inputs of the subsequent discriminator portion. Thus, converter 10 receives a (frequency-modulated) analog IF signal with a center, or carrier, frequency $f_{IF}$, illustratively 4 MHz. In a down-converter of a previous patent application, the sampling clock CLK signal is received with a sample frequency $f_c$ always substantially equal to, and ideally exactly equal to, four times the IF carrier frequency (i.e. $f_c=4f_{IF}$), for producing the I and Q data streams at outputs 10c-1 and 10c-2, respectively, for introduction into the digital discriminator portion of the demodulator. The bandpass analog IF input signal is applied to the analog input 11a of a single ADC means 11, which receives the clock signals at a sampling-clock input 11b; in the previous converter, this provides four substantially-equally-spaced samples, each a digital data word of a plurality m of parallel data bits at a data output port 11c, during each cycle of the input analog signal. The clock signal can itself be the result of dividing a sampling signal, at a frequency $f_s$, substantially equal to $4f_{IF}$, by a factor $(2n+1)$, where n is an integer greater than zero; this division is carried out in a divider means 14. In actuality, means 14 is usually not present, and the clock CLK signal to input 10b has a frequency of $4f_{IF}/(2n+1)$. Frequency translation of the sampled data to baseband is then performed by a digital mixer means 12. The stream of digital data words from ADC means 11 is provided to a first mixer means input 12a. The mixer has a local oscillator input 12b at which is received a square-wave signal at substantially the IF frequency $f_{IF}$; this square-wave signal is provided by dividing the clock CLK signal by a factor of 4, in a divide-by-four means 15. The baseband data signal, at digital mixer output 12c, is applied to a data input 16a of an optional DC offset removal means 16, which, if used, also receives the clock signal at a second input 16b. The output 16c of the DC offset removal means is a stream of digital data words from which the effects of any DC bias on the analog input signal has been removed. This data stream is provided to the input 18a of a I/Q sorter means 18, having a second input 18b receiving a substantially square-wave signal at one-half the clock CLK frequency, as provided by a divide-by-two means 20. Sorter means 18 sorts the time-sequential, interleaved data words in a manner such that a pair of sorted in-phase $I_s$ and sorted quadrature-phase $Q_s$ data words simultaneously appear at sorter outputs 18c and 18d. The sampled data words which arrive at input 18a in a single stream at the sample rate thus leave in a pair of streams, each at half the input sample rate (e.g. the $I_s$ and $Q_s$ words stream out at $f_c/2$. An optional quadrature compensation means 22 receives the sorted $I_s$ and $Q_s$ data words and substantially removes the pair of modulated output side lobes which will normally occur if the sampling, or clock CLK, frequency $f_c$ is not exactly equal to four times the carrier frequency $f_{IF}$ of the IF signal input to the demodulator. If present, quadrature correction means 22 includes a compensate delay means 22-1, receiving the $I_s$ signal at a first input 22a for producing a delay-corrected in-phase I signal at a first output 22d, coupled to the complex digital sampler output node 10c-1, and also includes a misalignment correction means 22-2, receiving the $Q_s$ signal at a second input 22b and providing the quadrature-corrected, quadrature-phase Q data stream at an output 22d, for coupling to the complex digital sampler second output node 10c-2.

It will be seen that only a single ADC means 11 is utilized. Unlike the mostly-analog converter in some prior art demodulators, in this digital sampling converter analog mixers and a quadrature phase splitter are no longer needed. As the digital mixing process does not produce higher frequency terms, there is no longer any need for lowpass filters. Most importantly, there is no requirement for two totally separate channels, each containing a mixer, a filter and a ADC means so that the need for obtaining closely-matched phase and amplitude and response is removed. Further, simplification can be had by replacing means 18 and 22 with a digital Hilbert transform filter network, as described and claimed in the previously mentioned U.S. application Ser. No. 321,697.

The ADC sampling rate $f_c$ is selected by use of the sampling theorem for bandpass signals. For a signal in a bandpass having a lowest frequency $f_L$ of interest and a highest frequency $f_H$ of interest, the sampling criteria can be stated as: $2f_L/n > f_c > 2f_H/(n+1)$, and $n=0,1,2,\ldots,K$; with K being the number of sampling frequency bands allowable without occurrence of spectral aliasing. K is calculated from $K=\text{Int}(f_H/BW)$, where the bandwidth BW is $(f_H-f_L)$ and the Int(x) function extracts the largest integer not greater than the argument (x). For example, if $f_H=4.1$ MHz. and $f_L=3.9$ MHz., then BW=0.2 MHz. and $$K = \text{Int}\left(\frac{4.1}{0.2}\right) = \text{Int}(20.5) = 20.$$

Thus, there are 20 different sampling frequency $f_c$ ranges which can be used without spectral aliasing occurring. The first five ranges can be tabulated as follows:

| n | MIN $f_c = 2f_L/n$ | | MAX $f_c = 2f_H/(n+1)$ |
|---|---|---|---|
| 0 | INFINITY | $>f_c>$ | 8.2 MHz. |
| 1 | 7.8 MHz. | $>f_c>$ | 4.1 MHz. |
| 2 | 3.9 MHz. | $>f_c>$ | 2.73 MHz. |
| 3 | 2.6 MHz. | $>f_c>$ | 2.05 MHz. |
| 4 | 1.95 MHz. | $>f_c>$ | 1.64 MHz. |

It will now be seen that the digital sampling process used in the previous cases, i.e. $f_c=4f_{IF}$, has been in the n=0 range only.

Figure 2:
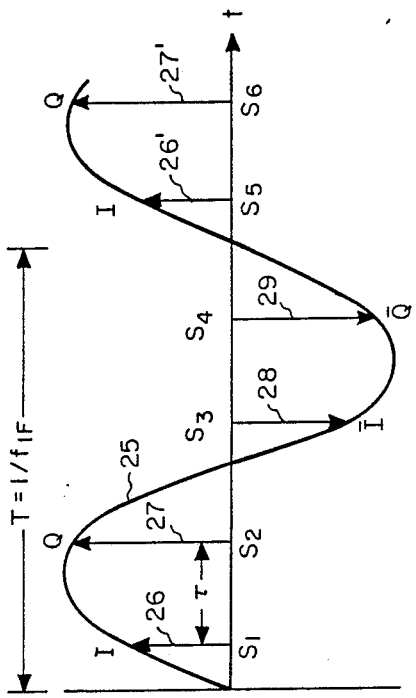
FIG. 2 is a graph illustrating an input analog signal wave and the nature of the complex digital sampling process, and useful in appreciating the present invention, for n=0.

FIG. 2 illustrates the complex digital sampling process, wherein an analog IF signal waveform 25, occupying a time interval $T=1/f_{IF}$, is sampled once every $\tau=(1/f_c)$ seconds. Illustrated is the n=0 case where sampling occurs four times during each cycle of the IF frequency, i.e. $f_c=4f_{IF}$. The first sample $S_1$ produces a sampled signal 26 of a first amplitude, which is converted to a data word to be assigned to the in-phase I data stream. The next sample $S_2$ occurs at time T/4 after sample $S_1$, and produces a data sample 27 assigned to the quadrature-phase Q data stream. Thereafter, after another time interval T/4, a third sample $S_3$ is taken; this is another I sample. Because the sample data 28 of sample $S_3$ is now at a time interval T/2 after the initial I sample $S_1$, it occurs during the opposite-polarity half-cycle from the $S_1$ sample. Similarly, the fourth sample $S_4$ is a next Q sample, provided at a time interval T/2 after the initial Q sample, so that the fourth sample data 28 occurs during the opposite-polarity half cycle from sample $S_2$. Thereafter, the 4-sample-per-cycle process is repeated, with an I data stream sample $S_5$, a Q data stream sample $S_6$, and so forth. It will be seen that the third and fourth samples in each cycle are properly assigned to the respective I and Q data streams, but require multiplication by a factor $-1$ to convert the I and Q data streams to their equivalent baseband form. This multiplication is effectively implemented as a simple inversion of the two's-complement representation of the sample data. Therefore, the complex digital sampling process can be accomplished in three separate steps: (a) sampling of the input waveform at a sampling frequency which is four times its center, or carrier, frequency divided by a factor $(2n+1)$, i.e. $f_c=4f_{IF}/(2n+1)$; (b) inversion of alternate pairs of the sampled signals; and (c) proper splitting of the stream of data samples into in-phase I and quadrature-phase Q components. These three process steps are carried out; respectively in ADC means 11, digital mixer means 12 and I/Q sorter means 18.

Figure 2A:
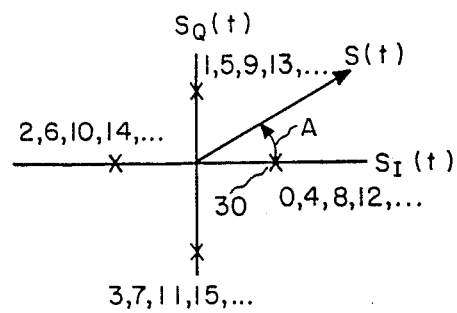
FIG. 2a is a graph illustrating the sampling process in the sample plane, for n=0.
Figure 2B:
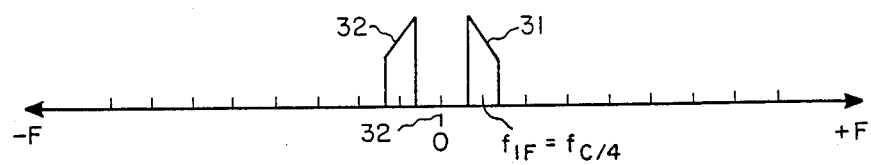
FIGS. 2b-2d are graphs illustrating the frequency domain components of the signals, for n=0, at various locations in the down-converter of FIG. 1.
Figure 2C:
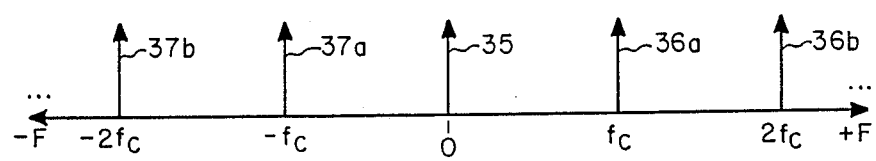
Figure 2D:
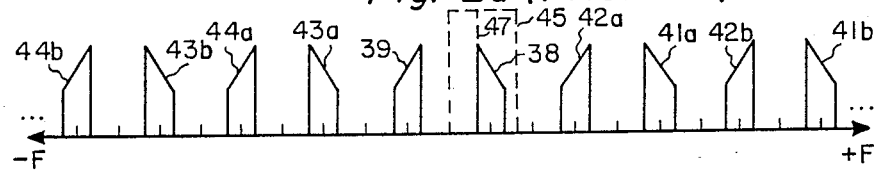

Referring now to FIG. 2a, the sampling process for the prior-art n=0 quadrative sampling method is shown in signal space form with respect to the in-phase $S_I(t)$ component and the quadrature $S_Q(t)$ component, which completely characterize the bandpass signal. Contrary to the usual convention, the I and Q components of the signal vector are here assumed to be stationary and the sampling vector S(t) is assumed to rotate in the coordinate plane defined by the in-phase component $S_I(t)$ and the quadrature component $S_Q(t)$. It is assumed, without loss of generality, that an initial, or zero-th, sample occurs when the sampling vector S(t) is at a position of 0° on the signal plane, that a first sample occurs when the signal vector is at 90°, a second sample when at 180°, a third sample at 270°, and so forth, as shown in FIG. 2a for the first 16 samples (samples 0–15). This is substantially similar to taking signal vector samples projected onto an orthogonal basis vector set in that manner now well understood to correspond to the homodyne, or zero IF, architecture. This corresponds to the frequency-domain situation shown in FIGS. 2b–2d: the basic IF signal has a positive-frequency bandpass region 31 and a negative frequency bandpass region 32, each centered about the intermediate frequency ($f_{IF}$), and forming mirror images of one another about the zero frequency axis 33 (FIG. 2b). As shown in FIG. 2c, the prior art n=0, four-samples-per-cycle process essentially generates sampling impulses at zero frequency (sampling impulse 35), positive-frequency sampling impulses at integer multiples of the sampling clock frequency $f_C$ (sampling impulses 36a, 36b, ...) and negative-frequency sampling impulses at integer negative multiples of the sampling frequency (sampling impulses 37a, 37b, ...). Convolution of the train of unit sampling impulse functions (FIG. 2c) and the bandpass signal spectrum (FIG. 2b) in accordance with the well known sampling method causes a sample bandpass signal to be replicated (FIG. 2d), about each of the sampling clock frequency impulses, with the positive bandpass frequency spectrum 31 appearing as positive-frequency spectrum 38 and negative bandpass frequency spectrum 32 appearing as negative-frequency spectrum 39, both about the DC frequency, and with other positive-frequency and negative-frequency bandpass regions appearing as upper sideband portions 41a, 41b, ... and lower sideband portions 42a, 42b, ... about positive-frequency impulses and as respectively lower frequency sidebands 43a, 43b, ... and upper frequency sidebands 44a, 44b, ... about negative-frequency impulse center frequencies. Passing the total signal of FIG. 2d through means 12 will multiply the spectrum by a positive-frequency lowpass function 45 and adjust the bottom of the bandpass spectrum 47 to zero baseband frequency, to yield a desired baseband signal, translated to zero frequency. Without loss of generality, it should be understood that this process occurs for both the I and Q data stream signals so that the real and imaginary IF signal components can be extracted for subsequent signal processing (e.g. demodulation).

Figure 3A:
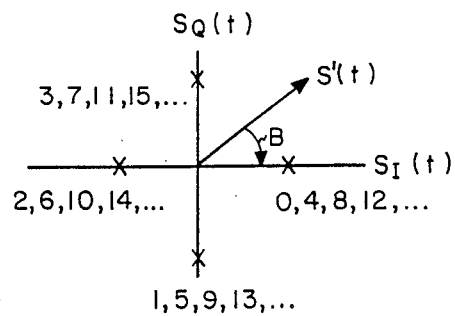
FIG. 3a is a graph illustrating the sampling process in the sample plane, for n=1.
Figure 3B:
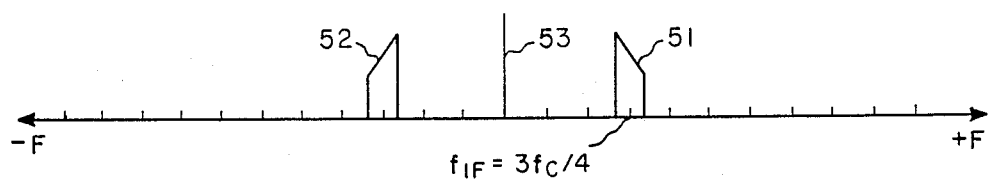
FIGS. 3b-3d are graphs illustrating the frequency domain components of the signals, for n=1, at various locations in the down-converter of FIG. 1.
Figure 3C:
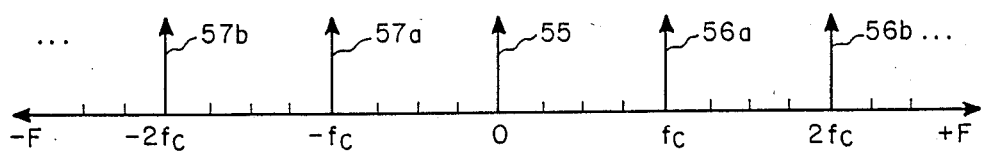
Figure 3D:
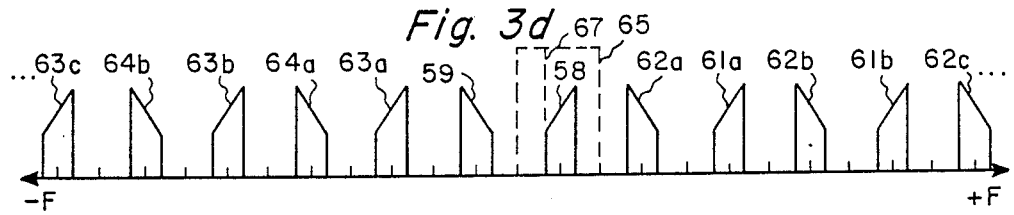
Figure 4A:
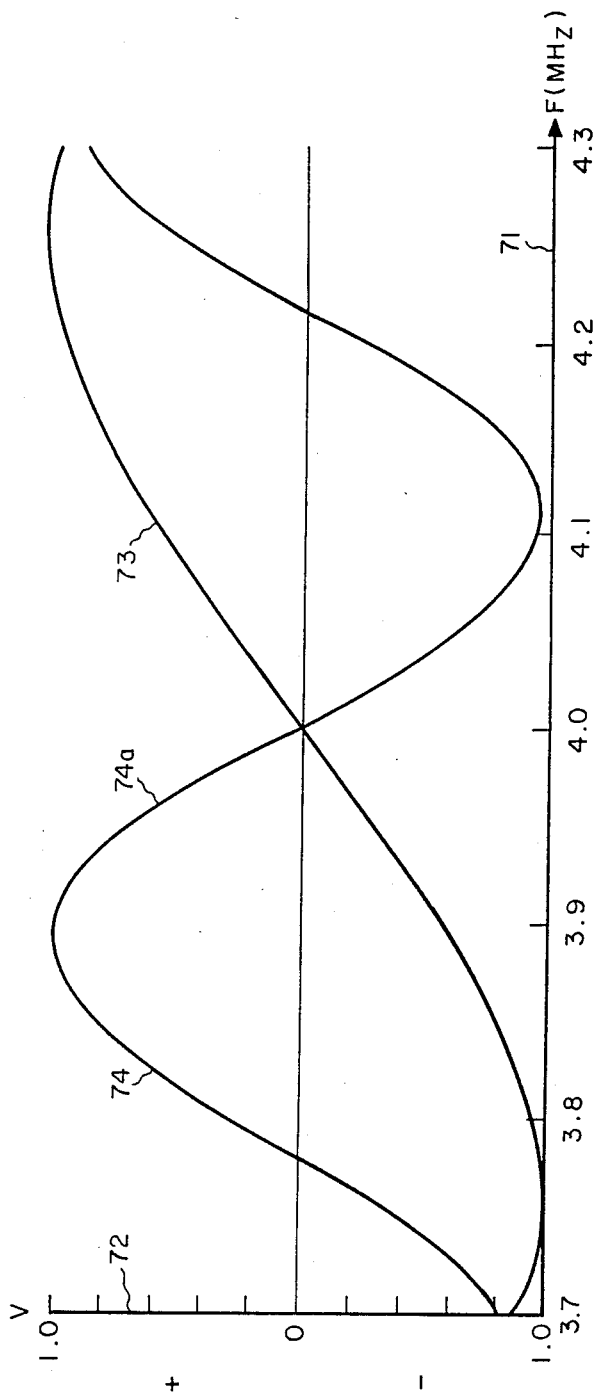

Increasing the sampling time intervals from $\tau=1/(4f_{IF})$ to $\tau'=(2n+1)/(4f_{IF})$, with n being selected from the set $(1, 2, 3, \ldots, K)$, still allows the desired time multiplexed I/Q sampling process to be achieved, but with the minimum sampling rate being either reduced for a given IF frequency, or, conversely, with the maximum IF frequency being increased for a given sampling rate. For n=1, it may be assumed, without loss of generality, that the initial, or zero-th, sample occurs when the sampling vector is at a position of 0° on the signal plane, the next sample occurs at the 270° position, the third sample at the 180° position, the fourth at 90°, and so on. Thus, while the initial (zero-th) sample is an in-phase sample $S_I(t)$, the next sample is $S_Q^-(t)$, followed by the $S_I^-(t)$ sample and then the $S_Q(t)$ sample, with n=1 and the sampling rate equal to 4/3 times the IF frequency $f_{IF}$. FIGS. 3b–3d illustrate the respective frequency spectra for a coherent IF-to-baseband translation process with a sampling rate $f_c=(4/3)f_{IF}$. Here, the center frequency of both the positive-frequency bandpass signal 51 and the negative-frequency bandpass signal 52, is only three-quarters of the sampling frequency. The sampling signal (FIG. 3c) still appears to be a succession of unit sampling impulse functions having a DC component 55, positive frequency components 56a, 56b, ... (at positive integer multiples of the sampling clock frequency $f_c$) and negative frequency components 57a, 57b, ... (at negative integer multiples of the sampling clock frequency). In sampling, the bandpass signal is replicated about each of the sampling clock frequency impulses, but, because of the now-reversed sequence of sampling (indicated by the clockwise movement of sampling vector S'(t)), the negative bandpass frequency spectrum 52 appears as the now-positive bandpass spectrum 58 above the DC frequency 53. The reversal of upper and lower sidebands (61i, 62i, 63i, 64i, where i=a, b, c, ...) for both positive and negative frequencies will be noted. Again, passing the total signal through the proper post-sampling network means will multiply the spectrum of the now-positive bandpass signal 58 with a positive-frequency lowpass function 65 and the digital mixing means will adjust the bottom of the bandpass to zero baseband frequency 67, to yield the extracted real and imaginary components for subsequent signal processing. It will be seen that, because the second sample corresponds to a sample of 270°, with a third sample at 180° and the fourth sample at 90°, there is an implication that the quadrature signal sample is effectively multiplied by −1; in the case of subsequent digital FM demodulation, the slope of the discriminator response curve that will be reversed. That this actually occurs is illustrated in FIG. 4a, wherein FM discriminator response is graphed with the instantaneous IF input frequency F being plotted along abscissa 71 and discriminator output V being plotted along ordinate 72. In the illustrated discriminator, a IF frequency of 4.0 MHz. is utilized. The known discriminator with sampling rate of $f_c=4f_{IF}$ produces the response curve 73, which has an increasing output voltage V for increasing input frequency F, i.e. a positive slope. Utilizing our novel converter with a sampling frequency $f_c=(4/3)f_{IF}$ produces response curve 74, whiCh has a central section 74a (between the lower IF passband frequency limit of 3.9 MHz. and the upper IF passband frequency limit of 4.1 MHz.) with a negative slope, which slope change results from the change of the time ordering of the quadrature samples. Thus, a 4 MHz. FM signal can be demodulated by use of a four-times clockrate $f_c=16$ MHz., or by use of a four-thirds IF frequency clock, with a 5⅓ MHz. clockrate (and, if necessary, a subsequent demodulator output signal polarity inverter). It will be seen that the sampling rate of the ADC is accordingly reduced by a factor (2n+1), e.g. a factor of 3 with n=1, for substantially the same functionality. Referring now to FIG. 4b, use of the same 16 MHz. sampling frequency can, if the ADC maximum input frequency allows, be used to down-convert a IF analog signal with a center frequency which is (2n+1) times greater than previous, i.e. the new $f_{IF'}=(2n+1)f_{IF}$; therefore, for n=1, a IF signal at $(2n+1=3)\times f_{IF}(4$ MHz.), or 12 MHz., can be properly sampled and demodulated. In FIG. 4b, wherein the IF analog signal input frequency F is plotted along abscissa 76 and demodulator output V is plotted along ordinate 77, the response curve 78 will be seen to not only be substantially linear, but to have the negative slope, which will be noted to be characteristic of odd-subharmonic (n=1, 3, 5, ...) sampling.

Referring finally to FIG. 4c, wherein the IF analog signal input frequency is plotted along abscissa 81 and demodulator output V is plotted along ordinate 82, a response curve 83 for second-subharmonic sampling, with n=2, and governed by the sampling-IF frequency relationship $f_c=(4/5)f_{IF}$, will be seen to have a positive slope, characteristic of an even-order (n=2, 4, 6, ...) subharmonic sampling down-converter. Thus, with the same 16 MHz. sampling clock frequency $f_c$, an input center frequency $f_{IF}$ of 20 MHz. can be properly sampled and downconverted; this is fully (2n+1) times the original IF analog signal frequency of 4 MHz. convertible by the prior-art non-harmonic-sampling down-converter. It will be understood that the ability to utilize higher IF signal frequencies, without changing the sampling CLK frequency, allows receiver specifications (such as image rejection and the like) to be improved.

While one presently preferred embodiment of our digital subharmonic sampling converter, for use in a digital demodulator and the like, has been described in detail herein, many modifications and variations will now become apparent to those skilled in the art. It is our intent, therefore, to be limited only by the scope of the appending claims and not by the specific details and instrumentalities presented herein by way of explanation of one embodiment.

What we claim is:

1. A digital subharmonic down-converter, receiving an analog IF signal for providing substantially simultaneous output streams of in-phase I data and quadrature-phased Q data words, comprises:
    ADC means for converting the analog IF signal, having a frequency $f_{IF}$, to a stream of digital data samples taken at a sampling frequency $f_c$;
    digital mixer means for converting the digital data sample stream to a stream of baseband digital data words;
    sorter means for separating interleaved alternating ones of the baseband data words stream into sequential sorted pairs of an in-phase I data word and a quadrature-phase Q data word; and
    means for causing the ADC means sampling frequency $f_c$ to be a subharmonic of the IF frequency, with $$f_c = \frac{4}{2n+1} f_{IF},$$

where n is a selected integer greater than zero.

2. The down-converter of claim 1, wherein the IF signal has a maximum frequency $F_H$ and a minimum frequency $F_L$ and n is less than $K = \text{Int}(f_H/BW)$, where $BW = (f_H - f_L)$.

3. The down-converter of claim 2, further comprising means for compensating the sorted pairs of data words for at least one of quadrature misalignment offset and input signal DC bias.

4. The down-converter of claim 2, wherein n=1 and $$f_c = \frac{4}{3} f_{IF}.$$

5. The down-converter of claim 4, wherein $f_{IF}$ is on the order of 10 MHz.

6. The down-converter of claim 5, wherein $f_{IF}$ is between about 4 and about 20 MHz.

7. The down-converter of claim 2, wherein n=2 and $$f_c = \frac{4}{5} f_{IF}.$$

8. The down-converter of claim 7, wherein $f_{IF}$ is on the order of 10 MHz.

9. The down-converter of claim 8, wherein $f_{IF}$ is between about 4 and about 20 MHz.

* * * * *